United States Patent
Nakao

(10) Patent No.: US 8,338,875 B2
(45) Date of Patent: Dec. 25, 2012

(54) NONVOLATILE MEMORY

(75) Inventor: Takashi Nakao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 658 days.

(21) Appl. No.: 12/467,717

(22) Filed: May 18, 2009

(65) Prior Publication Data

US 2009/0283821 A1 Nov. 19, 2009

(30) Foreign Application Priority Data

May 19, 2008 (JP) ................................. 2008-130993

(51) Int. Cl.
*H01L 29/788* (2006.01)
*H01L 29/792* (2006.01)

(52) U.S. Cl. ..... 257/315; 257/324; 257/508; 257/E29.3; 257/E29.309

(58) Field of Classification Search .................. 257/315, 257/324, 508, E29.3, E29.309; 438/454
See application file for complete search history.

(56) References Cited

U.S. PATENT DOCUMENTS

| 2006/0131637 A1 | 6/2006 | Kakoschke et al. |
| 2007/0018276 A1 | 1/2007 | Itou |
| 2008/0203458 A1* | 8/2008 | Hwang .......................... 257/314 |

FOREIGN PATENT DOCUMENTS

JP 2005-530362 10/2005

* cited by examiner

*Primary Examiner* — Mary Wilczewski
*Assistant Examiner* — Toniae Thomas
(74) *Attorney, Agent, or Firm* — Finnegan, Henderson, Farabow, Garrett & Dunner, L.L.P.

(57) ABSTRACT

Isolation trenches are formed in the main surface of a semiconductor substrate, and isolation regions. are embedded in these trenches. First insulating films, charge storage layers, a second insulating film, and a control gate are formed on the main surface of the semiconductor substrate sectioned by the isolation regions. Shielding layers are arranged in the isolation regions in such a manner that their bottom portions are lower than the channel regions and their upper portions are higher than at least the main surface of the semiconductor substrate to provide an electric and magnetic shield between their storage layers and channel regions of adjacent memory cells.

6 Claims, 2 Drawing Sheets

NONVOLATILE MEMORY

CROSS-REFERENCE TO RELATED APPLICATIONS

This application is based upon and claims the benefit of priority from prior Japanese Patent Application No. 2008-130993, filed May 19, 2008, the entire contents of which are incorporated herein by reference.

BACKGROUND OF THE INVENTION

1. Field of the Invention

The present invention relates to a nonvolatile memory and a manufacturing method thereof.

2. Description of the Related Art

The cost of a NAND flash memory can be most effectively reduced by achieving finer patterning and thereby increasing the chip yield per wafer, or by increasing the number of memory cells per unit area and thereby increasing the capacity.

If, however, the NAND cells that store charge in their floating gates (FGs) are simply made smaller, the spacing between active areas (AA) and between the floating gates of adjacent memory cells is reduced. This would increase interference between cells (see Jpn. PCT National Publication No. 2005-530362). In other words, the FGs of adjacent memory cells are arranged closer as the patterning becomes finer. Then, the charge accumulated in the FGs causes a leakage field and changes the threshold voltage of the cell transistor, which results in a read error.

In MONOS and MNOS memories, in which charge is uniformly distributed, the center of charge serves as the center of the cell. Each cell can therefore be separated from the charge for a distance equivalent to half the width of the AA or FG. However, as the packing density increases, the same read-error problem arises.

For this reason, a memory cell structure of a nonvolatile memory and method thereof, with which interference between cells can be suppressed, have been sought.

BRIEF SUMMARY OF THE INVENTION

According to a first aspect of the present invention, there is provided a nonvolatile memory comprising: a semiconductor substrate; trenches formed for isolation in a main surface of the semiconductor substrate; isolation regions formed by embedding an insulating material in the trenches; a first insulating film formed on the main surface of the semiconductor substrate sectioned by the isolation regions; a charge storage layer formed on the first insulating film; a second insulating film formed on the charge storage layer; a control gate formed on the second insulating film; and a shielding layer formed in an electrically floating state in each of the isolation regions, with a bottom portion thereof lower than a channel region and a top portion thereof higher than at least the main surface of the semiconductor substrate.

According to a second aspect of the present invention, there is provided a nonvolatile memory comprising: a semiconductor substrate; trenches formed for isolation in a main surface of the semiconductor substrate; isolation regions formed by embedding an insulating material in the trenches; a first insulating film formed on the main surface of the semiconductor substrate sectioned by the isolation regions; a charge storage layer formed on the first insulating film; a second insulating film formed on the charge storage layer; a control gate formed on the second insulating film; and a shielding layer formed in each of the isolation regions to have a bottom portion thereof in contact with the semiconductor substrate to establish an electrical connection and a top portion thereof higher than at least the main surface of the semiconductor substrate.

According to a third aspect of the present invention, there is provided a method of manufacturing a nonvolatile memory, comprising: forming a stacked film of a first insulating film and a charge storage layer material film on a main surface of a semiconductor substrate; etching the charge storage layer material film, the first insulating film and the semiconductor substrate, to form isolation trenches, a gate insulating film and a charge storage layer; forming a film of an embedding material for the isolation trenches; etching back the embedding material by anisotropic etching to form side-wall spacers on sidewalls of the charge storage layer and the isolation trenches; and forming a shielding layer in each of the isolation trenches on the sidewalls of which the side-wall spacers are arranged, in such a manner that a bottom portion thereof is lower than a channel region and a top portion thereof is higher than at least the main surface of the semiconductor substrate.

DETAILED DESCRIPTION OF THE INVENTION

Exemplary embodiments of the present invention will be explained below with reference to the attached drawings.

Figure 1:
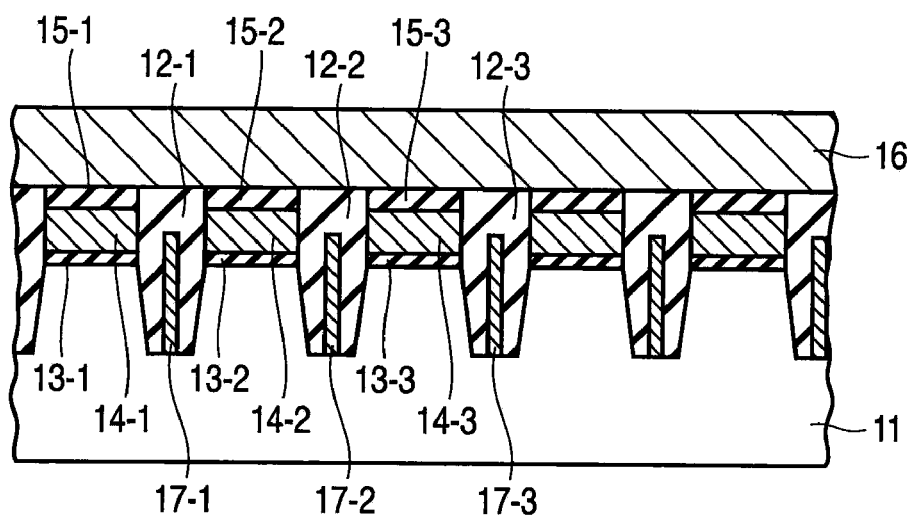
FIG. 1 is a diagram for explaining a nonvolatile memory according to an embodiment of the present invention, showing a section of the memory cell structure.

FIG. 1 explains a nonvolatile memory according to an embodiment of the present invention and shows a section of the memory cell structure. In this drawing, a NAND flash memory is presented as an example. STI regions 12-1, 12-2, 12-3, . . . are arranged as isolation regions on the main surface of a semiconductor substrate (e.g., silicon substrate) 11. The STI regions 12-1, 12-2, 12-3, . . . are formed by embedding an insulating material for element isolation in trenches that are formed in the main surface of the semiconductor substrate 11.

Gate insulating films (first insulating films) 13-1, 13-2, 13-3, . . . are deposited on the main surface of the semiconductor substrate 11, which is sectioned by the STI regions 12-1, 12-2, 12-3, . . . , and floating gates 14-1, 14-2, 14-3, . . . are deposited on the gate insulating films 13-1, 13-2, 13-3 . . . . Furthermore, interpoly insulating films (second insulating films) 15-1, 15-2, 15-3, . . . are formed on these floating gates 14-1, 14-2, 14-3, . . . , and a control gate (CG) 16 is deposited on the interpoly insulating films 15-1, 15-2, 15-3, . . . .

Shielding layers 17-1, 17-2, 17-3, . . . , which are formed of a conductive material in the shape of plates, are provided in the STI regions 12-1, 12-2, 12-3, . . . (between every two adjacent cells). These shielding layers 17-1, 17-2, 17-3, . . . act as electric and magnetic shields between the floating gates (charge storage layers) 14-1, 14-2, 14-3, . . . and the channel regions of adjacent memory cells (cell transistors). The bottom portions of the shielding layers 17-1, 17-2, 17-3, . . . are in contact with the semiconductor substrate 11 at the bottom of the STI regions 12-1, 12-2, 12-3, . . . , where an electrical connection to the substrate 11 is established. The top portions of the shielding layers 17-1, 17-2, 17-3, . . . should be higher than the main surface of the substrate 11. According to the present embodiment, the top portions are designed to be higher than the bottom surface of the floating gates 14-1, 14-2, 14-3 . . . .

As a conductive material for the shielding layers 17-1, 17-2, 17-3, . . . , a donor-doped or acceptor-doped silicon film (amorphous, monocrystal, or polycrystal) and refractory metals such as tungsten can be adopted. More specifically, polycrystalline silicon doped with phosphorus or boron may be used. Undoped Si or SiGe, a metal silicide, and a conductive metal oxide or metal nitride are also effective from the aspects of their characteristics in stability, heat resistance and oxidation resistance. In particular, a barrier metal such as TiN, a silicide metal such as TiSi, CoSi or NiSi, or a barrier metal such as TiN is formed first, and then a refractory metal material such as tungsten is deposited thereon. Furthermore, an electrical contact that does not include a PN junction can be established by using the same silicon as the one used for the bottom portion of the STI regions so as to match the polarity with that of the dopant.

With such a memory cell structure, electric flux lines from the charge stored in the floating gates 14-1, 14-2, 14-3, . . . can be shielded against by the shielding layers 17-1, 17-2, j17-3, . . . . In this manner, the influence of the charge in the floating gates 14-1, 14-2, 14-3, . . . upon adjacent cell transistors can be suppressed, and fluctuations in the threshold voltage of the cell transistors can be avoided. Furthermore, the shielding layers 17-1, 17-2, 17-3, . . . are electrically connected to the substrate 11. Thus, the shielding layers are protected against charge injection by, for example, the leakage current that flows in through the insulating film during the operation of the nonvolatile memory, which would give the shielding layers themselves a potential and generate an electric field in the floating gates (charge storage layers) or the channel regions of adjacent cells. Hence, the interference between the cells can be reduced.

According to the above embodiment, the structure is designed in such a manner that the shielding layers 17-1, 17-2, 17-3, . . . are brought into contact with the semiconductor substrate 11 to establish an electric connection. However, as long as the bottom portions of the shielding layers 17-1, 17-2, 17-3, . . . are lower than the channel region of the cell transistor and low enough to provide an electric and magnetic shield between the floating gates and the channel regions of the adjacent memory cells, the electric connection does not always have to be achieved. If each of the shielding layers 17-1, 17-2, 17-3, . . . has a larger volume than that of the floating gate, the layers may be arranged in an electrically floating state. With the shielding layers formed in the floating state, sidewall spacers do not need to be provided in the isolation trenches. Then, the RIE process for retaining the sidewall can be omitted, and the entire manufacturing process can be simplified.

Furthermore, an FG cell is used as an example in the above explanation, but the embodiment can be equally applied to a MONOS or MNOS memory that adopts a charge trap insulating film such as a silicon nitride film for a charge storage layer.

Figure 2:
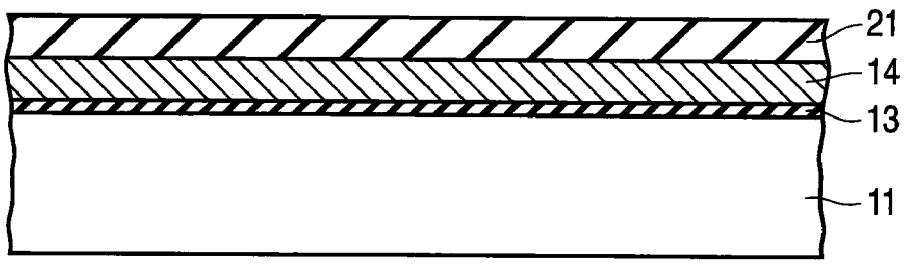
FIG. 2 is a diagram for explaining a method of manufacturing a nonvolatile memory according to an embodiment of the present invention, showing a section of the memory cell structure of FIG. 1 in the first manufacturing process step.

FIGS. 2 to 6 are presented to explain a manufacturing method of a nonvolatile memory according to an embodiment of the present invention, showing sectional views of the memory cell structure illustrated in FIG. 1 in the first to fifth process steps. First, as illustrated in FIG. 2, a tunnel insulating film (gate insulating film) 13 is formed of a silicon oxynitride film on the main surface of the semiconductor substrate 11, and a polycrystal silicon film 14 doped with phosphorus is formed thereon as a material of the floating gates. Then, a stacked film 21 of a silicon nitride film and a silicon oxide film is deposited thereon to serve as a hard mask necessary for STI processing.

Figure 3:
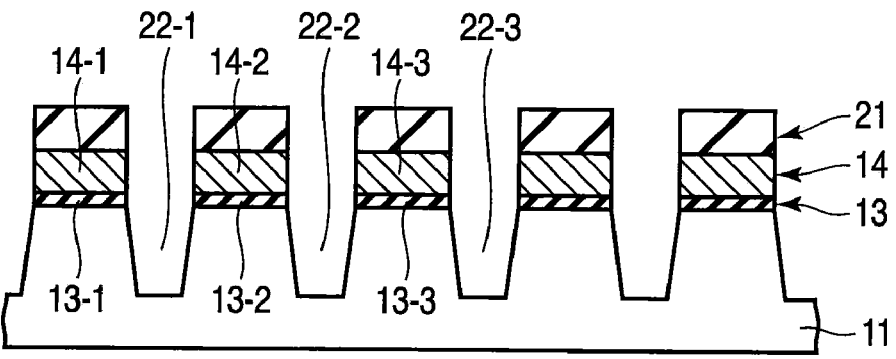
FIG. 3 is a diagram for explaining the method of manufacturing the nonvolatile memory according to the embodiment of the present invention, showing a section of the memory cell structure of FIG. 1 in the second manufacturing process step.

Thereafter, as illustrated in FIG. 3, photolithography is performed, and the stacked film 21 is formed into a hard mask by RIE. By use of this hard mask, the polycrystal silicon film 14, tunnel insulating film 12 and semiconductor substrate 11 are processed by anisotropic etching such as RIE. As a result, the STI trenches 22-1, 22-2, 22-3, . . . are formed, and the polycrystal silicon film 14 and tunnel insulating film 12 are divided into, and the floating gates 14-1, 14-2, 14-3, . . . and tunnel insulating films (gate insulating films) 13-1, 13-2, 13-3, . . . for individual memory cells.

Figure 4:
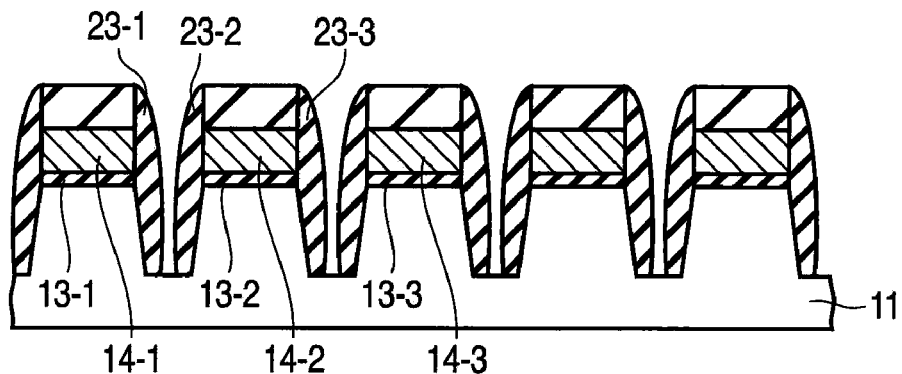
FIG. 4 is a diagram for explaining the method of manufacturing the nonvolatile memory according to the embodiment of the present invention, showing a section of the memory cell structure of FIG. 1 in the third manufacturing process step.

Next, a silicon oxide film, which is an STI embedding material, is deposited in a conformal manner by LPCVD using $SiH_2Cl_2$ and $N_2O$ gases or the like. Then, the oxide film is etched back by RIE or the like so that portions thereof remain on the sidewalls of the floating gates and the active areas and are formed into side-wall spacers 23-1, 23-2, 23-3, . . . (FIG. 4).

The space between the side-wall spacers 23-1, 23-2, 23-3, . . . determines the thickness (width) of the shielding layers 17-1, 17-2, 17-3 . . . . The thickness of the oxide films is calculated from the spacing width of the STI regions, the width of the conductive material, and the horizontal etching width during the RIE for the spacers. For example, when the spacing between the STI regions is 35 nm, the oxide films are formed around 15 nm thick. When the oxide film is RIE-processed for the vertical etching amount of 1 nm, 14-nm-thick spacers are formed on both sidewalls of each STI region so that 7-nm spacing is provided between the sidewall spacers.

Figure 5:
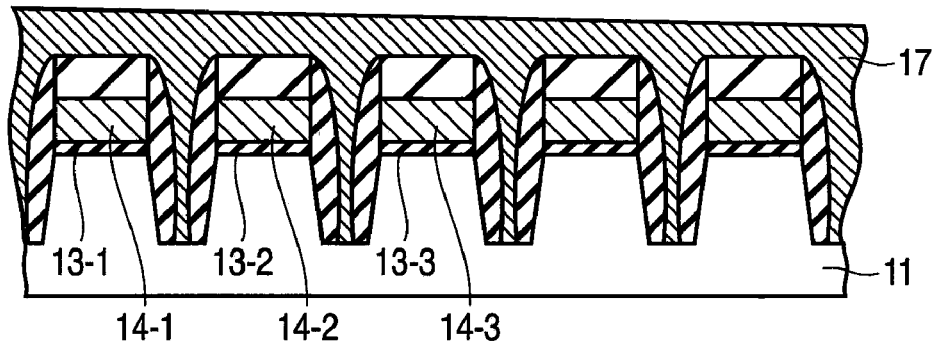
FIG. 5 is a diagram for explaining the method of manufacturing the nonvolatile memory according to the embodiment of the present invention, showing a section of the memory cell structure of FIG. 1 in the fourth manufacturing process step.

Thereafter, as illustrated in FIG. 5, amorphous silicon is doped in situ with phosphorous and formed to be 7 nm or greater in thickness, for example 60 nm. This amorphous silicon becomes the shielding layer 17.

Next, the silicon (Si) is selectively etched back by CMP or RIE, and thereby walls of the shielding layers 17-1, 17-2, 17-3, . . . , which are 7 nm wide and doped with phosphorus, are arranged in the middle of the STI regions 12-1, 12-2, 12-3, . . . .

Figure 6:
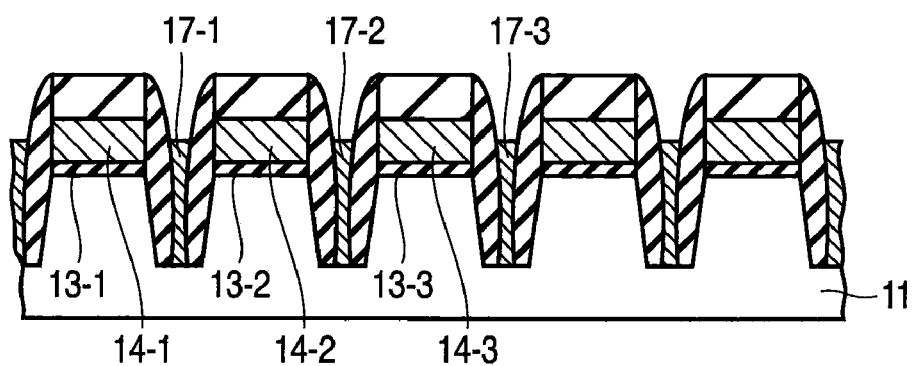
FIG. 6 is a diagram for explaining the method of manufacturing the nonvolatile memory according to the embodiment of the present invention, showing a section of the memory cell structure of FIG. 1 in the fifth manufacturing process step.

If there is any position at which the shielding layers 17-1, 17-2, 17-3, . . . should not be provided due to the design of the structure, any portion of the structure other than this position is coated with photoresist or the like after the step of FIG. 6, and isotropic or anisotropic etching is performed on the silicon to remove the entire shielding material.

The same procedure as the conventional flash memory manufacturing process should be taken for the rest of the process. The gaps created by the STI are filled with an insulating film such as a silicon oxide film in the CVD process, and the structure is thereby planarized. The film quality is improved by annealing at this step. The phosphorous-doped amorphous silicon shielding layer is thereby polycrystallized, and the conductivity is further improved by the activated phosphorous.

After the STI regions are completed, the masking material is removed, and an interpoly insulating film is deposited on the polycrystalline silicon film, which serves as floating gates. The interpoly insulating film may be a stacked film of silicon oxide films and silicon nitride films; for example, silicon oxide film/silicon nitride film/silicon oxide film, silicon nitride film/silicon oxide film/silicon nitride film/silicon oxide film, silicon nitride film/silicon oxide film/silicon nitride film/silicon oxide film/silicon nitride film, or the like. Thereafter, another polycrystalline silicon film, which serves as a control gate, is deposited. A hard mask is formed thereon, and the lithography and RIE processing are performed on this structure. The control gate is formed in this manner, and the memory cells of the flash memory are completed. As a result, the memory cell structure of FIG. 1 can be achieved.

According to the above manufacturing method, the shielding layers 17-1, 17-2, 17-3, . . . are brought into contact with the semiconductor substrate 11 (i.e., grounded). Hence, the shield is prevented from being electrically charged by the accumulated charge in the floating gate and bearing a potential during the ion injection in the semiconductor device manufacturing process, charge injection by ions such as in RIE, and a plasma exposing process such as plasma CVD.

Furthermore, a donor-doped or acceptor-doped silicon film (amorphous, monocrystal or polycrystal) is adopted as a conductive material for the shielding layers 17-1, 17-2, 17-3, . . . . Because this is the same material as the conventional gate material and shows excellent heat resistance, integration compatibility can be improved, and development in the point of production site can be facilitated.

In place of the aforementioned doped silicon, a refractory metal such as tungsten may be adopted for a conductive material so that selectivity for silicon can be achieved. Thus, when processing the CG and FG at a time, the shielding layer material can be prevented from receding.

With the nonvolatile memory and the manufacturing method thereof according to the present embodiments, a conductive material that acts as a shielding layer is arranged to provide an electric and magnetic shield between the charge storage layers and the channel regions of adjacent memory cells. Hence, adjacent memory cells do not have an influence on one another, and interference between the cells can be suppressed.

According to the above embodiments, a conductive material that acts as a shielding layer is arranged between the charge storage layers and the channel regions of adjacent memory cells to provide an electric and magnetic shield between adjacent memory cells. However, any shielding layer can produce similar effects to a certain level as long as it is designed to have a structure that reduces electrical and magnetic influence of adjacent memory cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile memory comprising:
a semiconductor substrate;
trenches formed for isolation in a main surface of the semiconductor substrate;
isolation regions formed by embedding an insulating material in the trenches;
a first insulating film formed on the main surface of the semiconductor substrate sectioned by the isolation regions;
a charge storage layer formed on the first insulating film;
a second insulating film formed on the charge storage layer;
a control gate formed on the second insulating film; and
a shielding layer formed in each of the isolation regions to have a bottom portion thereof in contact with the semiconductor substrate to establish an electrical connection and a top portion thereof higher than at least the main surface of the semiconductor substrate.

2. The memory according to claim 1, wherein the top portion of the shielding layer is higher than a bottom surface of the charge storage layer.

3. The memory according to claim 1, wherein the shielding layer is formed of a semiconductor, a metal, or a metallic compound.

4. The memory according to claim 1, wherein the shielding layer is formed of donor-doped or acceptor-doped silicon, undoped silicon, silicon germanium, refractory metal, metal silicide, metal oxide or metal nitride.

5. The memory according to claim 1, wherein the charge storage layer is a floating gate.

6. The memory according to claim 1, wherein the charge storage layer is a charge storage insulating film.

* * * * *